(12) United States Patent
Moore (10) Patent No.: US 8,749,422 B1
(45) Date of Patent: Jun. 10, 2014

(54) SIGNAL CONVERSION USING STATE SENSITIVE DEVICE ARRAYS

(71) Applicant: Charles Cullen Moore, Allen, TX (US)

(72) Inventor: Charles Cullen Moore, Allen, TX (US)

( * ) Notice: Subject to any disclaimer, the term of this patent is extended or adjusted under 35 U.S.C. 154(b) by 0 days.

(21) Appl. No.: 13/714,628

(22) Filed: Dec. 14, 2012

(51) Int. Cl.
*H03M 1/12* (2006.01)

(52) U.S. Cl.
USPC .......................................... 341/155; 341/120

(58) Field of Classification Search
USPC ......... 341/155, 172, 144, 120, 118, 141, 122;
324/658; 365/185.03, 185.21; 702/185
See application file for complete search history.

(56) References Cited

U.S. PATENT DOCUMENTS

| | | | | |
|---|---|---|---|---|
| 5,751,632 | A * | 5/1998 | Choi et al. | 365/185.03 |
| 6,038,166 | A * | 3/2000 | Wong | 365/185.03 |
| 7,663,929 | B2 * | 2/2010 | Ogawa | 365/185.21 |
| 7,756,680 | B2 * | 7/2010 | Hammerschmidt | 702/185 |
| 8,125,231 | B2 * | 2/2012 | Khanna et al. | 324/658 |
| 8,276,467 | B2 * | 10/2012 | Fritzsche et al. | 73/862.046 |
| 8,477,120 | B2 * | 7/2013 | Jang et al. | 345/179 |

OTHER PUBLICATIONS

Massimiliano Di Ventra, Circuit Elements with Memory: Memristors, Memcapacitors, and Meminductors, Proceedings of the IEEE, Oct. 2009, 1717-1724, vol. 97, No. 10, United States.
Unknown, Innovative Blood: The Missing Circuit Element; www.innovativeblood.blogspot.com/2011/02/memristor-missing-circuit-element.html.

* cited by examiner

*Primary Examiner* — Peguy Jean Pierre
(74) *Attorney, Agent, or Firm* — Harper Washam LLP; Steven H. Washam (57) ABSTRACT

An analog to digital conversion device and method utilizing an array of state sensitive cells. A gate timing component selectively exposes each cell to an analog input signal to effect a change in the exposed cell's state. Upon shielding the cell from exposure, the state change is ascertained by a cell measurement component to determine a digital value representative of the input signal amplitude at exposure.

19 Claims, 6 Drawing Sheets

SIGNAL CONVERSION USING STATE SENSITIVE DEVICE ARRAYS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to electronic circuits for analog to digital conversion, and more specifically to electronic circuits for analog to digital or digital to analog conversion using state sensitive components that exhibit a memory characteristic.

2. Description of Related Art Including Information Disclosed Under 37 CFR 1.97 and 1.98

Analog-to-digital signal converters (ADC) are relatively well known in the industry. Such devices sample an analog input signal at a given time ($t_{sample}$) and convert the sample to a digital value representative of this signal. As the analog input amplitude varies over time, the discrete samples of this input signal result in a string of digital values that allow the continuously varying analog signal to be represented in the digital domain for subsequent processing using automated computing methods. The inverse, digital-to-analog signal converters (DAC) are also relatively well known. As the name implies, a DAC accepts a digital value input and produces an analog amplitude output that is representative of the digital input. If a string of digital values is supplied to the input of a DAC, the output is a reconstructed analog signal waveform. Typically, the greater the numeric value, the greater the analog signal output. The frequency at which the digital values are supplied to the DAC influences the frequency of the resulting analog waveform.

Examples of well-known ADCs include flash, successive-approximation, slope, and ramp type converters. Common to each is the use of comparator banks, clocks, counters, and other passive components that utilize a significant amount of space within (and without) an IC package and can be rather costly. Moreover, the large number of components adversely affects the speed at which such devices may operate. Examples of DACs include binary-weighted, R-2R ladder, and successive-approximation type converters. Like ADCs, DAC components are relatively large and costly as well and, consequently, can consume a significant amount of power.

In addition, such devices (ADCs and DACs) are volatile, meaning that when the power is removed the circuit "forgets" its previous state. Consequently, additional circuitry is required when a sample-and-hold functionality is desired. For example, it may be desirable to use an ADC on the input of an oscilloscope to sample a continuously varying analog input signal over a fixed period of time, and to retain this signal for subsequent analysis. A traditional ADC will require full conversion of the signal to a digital value at discrete time periods over this fixed period of time, and storage of the digital signal values in additional memory registers for use in the signal analysis. The speed at which this full conversion occurs can be limiting to the accuracy with which the ADC functions in this regard. Likewise, when recreating an analog waveform (for example, a waveform generator) using a DAC it is necessary to retain the digital input values in additional memory registers. Unless the memory registers are non-volatile, the digital values will have to be recreated or reinitialized whenever the circuitry is de-energized. Moreover, DAC devices incur substantial latency in the conversion process thereby limiting the effective frequency at which conversion may occur.

The present invention addresses these aforementioned shortcomings in ADC/DAC devices by utilizing state-sensitive cells in a non-volatile memory capacity, which affords circuits having fewer components and a reduced amount of physical space.

BRIEF SUMMARY OF THE INVENTION

Described herein is an analog to digital conversion device, the device comprising: a plurality of state sensitive cells, each adapted to selectively receive an analog input signal for conversion; a gate timing control component adapted to selectively determine which of the plurality of state sensitive cells is to receive the analog input signal at a given time; and a cell measurement control component adapted to measure the change in at least one characteristic of each of the plurality of state sensitive cells and to convert the measured change to a digital value representative of the received analog input signal amplitude. Additional embodiments and variations thereof are also included.

Also described herein is a method for performing analog to digital conversion of an analog input signal, the method steps comprising: a) providing an array of state sensitive cells, each cell having been initialized to an initial state value; b) exposing a first cell of the array to an analog input signal for a period of time to alter the first cell's initial state value; c) shielding the first cell from the analog input signal while measuring the change in the first cell altered state value; and d) determining a digital value based upon this altered state value, the digital value representative of the input signal amplitude to which the first cell was exposed. Additional embodiments and variations thereof are also included.

BRIEF DESCRIPTION OF THE SEVERAL VIEWS OF THE DRAWING(S)

The present invention will be more fully understood by reference to the following detailed description of the preferred embodiments of the present invention when read in conjunction with the accompanying drawings, wherein.

The above figures are provided for the purpose of illustration and description only, and are not intended to define the limits of the disclosed invention. Use of the same reference number in multiple figures is intended to designate the same or similar parts. Furthermore, when the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the particular embodiment. The extension of the figures with respect to number, position, relationship, and dimensions of the parts to form the preferred embodiment will be explained or will be within the skill of the art after the following teachings of the present invention have been read and understood.

DETAILED DESCRIPTION OF THE INVENTION

Certain portions of an embodiment of the invention may include use of an automated computer-processing device for automatically executing stored computer program steps to achieve the desired functionality. This automation and speed may be beneficial for high-frequency signal conversion situations. For example, the "processing device" may be a personal computer, embedded microcontroller, digital signal processor (DSP), programmable logic device, a custom integrated circuit (IC) package, or even discrete circuitry designed to function as such. Such computer processing devices typically feature non-volatile and/or volatile memory for storage of the operating software and operational data, which is accessible by the processing device. A user interface device such as a keyboard, mouse, and display screen may also be included in an embodiment to allow the operator to control and read the system operational data and to act on the signal measurements obtained. In another embodiment the processing device is embedded as a component within a larger system and provides its measurement data directly to other system stages for subsequent use. The configuration, programming, and operation of such automated processing devices are well understood and, accordingly, no additional detail in this regard is necessary herein.

Automated processing device operating software may be stored on a computer readable medium for operation. As used herein "computer readable medium" means any tangible portable or fixed RAM or ROM device, such as portable flash memory, a CDROM, a DVDROM, embedded RAM or ROM integrated circuit devices, or the like. Further the software that controls an automated processing device may be implemented in a high-level programming language (for example, BASIC, C, C++, C#, .NET, etc.), a low level programming language (for example, assembly or machine code), or some combination of the two. Moreover, the software may utilize high-level scripting languages (for example, JavaScript) in addition to other compiled code. The utilization of one type of programming over another when implementing a certain portion of operating software is largely at the discretion of the dedicated programmer and, accordingly, because such languages are commonly understood, one of ordinary skill in the art to which the invention pertains will understand and appreciate that no further discussion is necessary.

State sensitive electrical devices that exhibit a memory characteristic are known in the industry. These devices include what are known as memristors, memcapacitors, and meminductors. The memristor was first envisioned by University of California at Berkeley professor Leon Chua in 1971, and was first fabricated by Hewlett-Packard labs in 2008 using solid-state $TiO_2$ thin films and even more recently using $VO_2$. A detailed theoretical and practical discussion of these devices is provided by Massimiliano Di Ventra, et al. in the publication entitled *Circuit elements with memory: memristors, memcapacitors and meminductors*, which was published in the Proceedings of the IEEE 97, 1717 (2009), and which is hereby incorporated herein by reference for all purposes.

Figure 1:
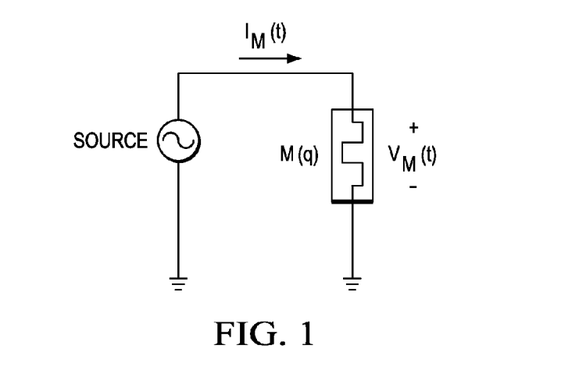
FIG. 1 is a schematic diagram of a basic memristor device.

FIG. 1 depicts a basic memristor-device schematic diagram. Memristor materials conduct charge and, therefore, have an inherent electrical resistance value. Within these memristive materials a change of resistance is realized by the displacement of oxygen ions due to current (electrical charge) flow. Thus, when exposed to a flow of electrical charge (current flow) for a period of time, the displaced oxygen ions that are forced to relocate from one area of the material to the other causes the formation of charge dipoles. This charge accumulation within the material opposes additional charge flow, which in turn is reflected as an increase in the electrical resistance of the memristor. If the forward voltage is removed and the charge flow halted, the charge carriers remain in this displaced state, hence the "memory" that such devices exhibit.

By reversing the charge flow it is possible to force the charge carriers to return to their original locations, thus restoring the material to its original state (and original electrical resistance). The amount of electrical charge that must be applied for a period of time reflects the voltage level to which the memristor was initially exposed that caused the charge carrier displacement. Thus, it is possible to determine the original voltage based upon the change in resistance of the memristor and/or the amount of charge flow necessary to restore the memristor to its original resistance value. It is important to note that such a "read" of this "memory" function is essentially a "destructive read" because the original charge carrier displaced state no longer exists within the material when complete. The resistance of a memristor, therefore, depends only on the amount of current flow through the device, with current related to the charge by its time derivative (dq/dt). Industry articles commonly define memristor operation mathematically by the following equations:

$$V_M(t) = R_M(x,I,t) \times I_M(t) \quad \text{Math (1)}$$

$$\dot{x} = f(x,I,t) \quad \text{Math (2)}$$

$$V_M(t) = R_M(q(t)) \times I_M(t) \quad \text{Math (3)}$$

$$R_M(q(t)) = V_M(t)/I_M(t), \text{ with } I_M(t) = dq/d(t) \quad \text{Math (4)}$$

Thus, the resistance function of the memristor is shown to be dependent upon the quantity of charge that flows through the device for a given amount of time, and is measured in Ohms. Memristors are considered passive devices because no charge is stored (i.e., $V_M(t)=0$ when $I_M(t)=0$). Thus, a first embodiment of the invention is realized in the application of such memristor components as state sensitive cells.

In another embodiment a memcapacitor is utilized as the state sensitive cell for selectively receiving the analog input signal. Memcapacitor materials exhibit a change in capacitance based upon an applied voltage over time, and may be realized in a physical semiconductor device due to the quantum-mechanical properties of the charge carriers and bound charges of the materials comprising the capacitor. Changes in device capacitance due to an applied voltage may be ascertained by detecting the changes in frequency response of the circuit or by detecting the charging/discharging time constant (i.e., RC time constant).

In another embodiment a meminductor is utilized as the state sensitive cell for selectively receiving the analog input signal. As with a standard inductor, a meminductor device will respond to the amount of flux in the circuit with change in inductance.

Figure 2:
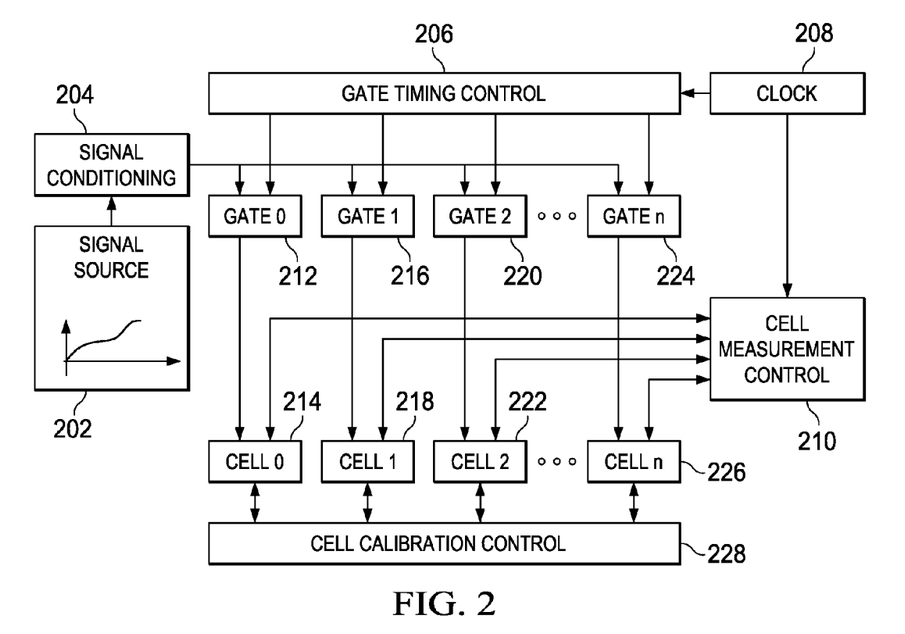
FIG. 2 is a block diagram of the state sensitive cell components that comprise an embodiment of the present invention in an analog to digital conversion capacity, highlighting conditioning, gate timing, and control circuitry.

FIG. 2 is a block diagram of the state sensitive cell components that comprise an embodiment of the present invention, highlighting conditioning and control circuitry. A signal source (202) is shown, which is an analog input signal that varies in amplitude over time. For example, the signal source (202) may be provided by any analog means, and can be a circuit under test. The input signal from the signal source can be DC or AC, and may include components of each over time. To ensure sufficient input signal strength, the input signal is subsequently fed to a signal conditioning stage (204). The signal conditioning stage (204) can be any electrical circuitry designed to accept an analog input signal and condition the input signal for subsequent measurement. For example, the circuitry may include isolators to prevent the measurement circuitry from excessively loading the input source; frequency filters; voltage amplifiers; or some combination thereof. The signal conditioning stage (204) may also provide variable frequency filtration and voltage amplification (variable gain) and may provide this as an additional input to the measurement control (210) circuitry for factoring into the final digital value calculations.

The state sensitive cells (214, 218, 222, and 226) are depicted as being variable in number. In this embodiment the circuitry includes Cell 0 (214), Cell 1 (218), Cell 2 (222), up to Cell n (226). Thus, an embodiment may use anywhere from a single cell to a maximum number of cells (Cell n). Each cell features dedicated gating circuitry (212, 216, 220, and 224). Thus, Cell 0 (214) is gated by Gate 0 (212), Cell 1 (218) is gated by Gate 1 (216), Cell 2 (222) is gated by Gate 2 (220), and Cell n (226) is gated by Gate n (224). Gate timing control circuitry (206) is provided to selectively determine which of the plurality of state sensitive cells (214, 218, 222, and 226) is to receive the analog input signal at a given time. Thus, during normal operation each cell in succession will be exposed to the input signal via the signal conditioning circuitry (204). However, in another embodiment multiple cells may be gated simultaneously to allow for redundant measurements or to check the calibration of cells against other cells. Further, cell calibration may locate cells that are degraded or non-functioning, and may inform the gate timing control (206) so that these degraded or defective cells may be bypassed during sampling operations. A clock circuit controls the gate timing control (206) and the cell measurement control (210) to allow for synchronous operation.

Figure 3:
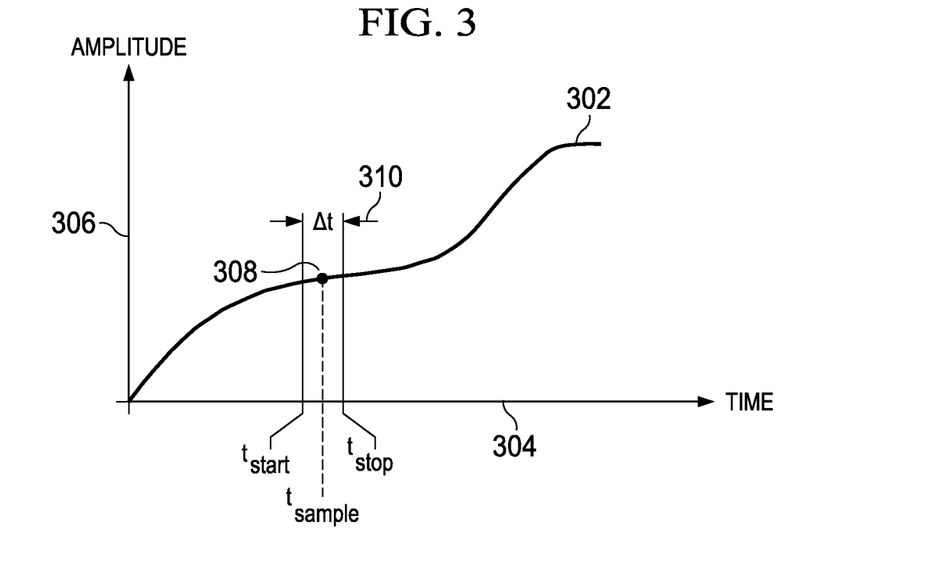
FIG. 3 is a graph depicting an input signal waveform's amplitude with respect to time, highlighting the sampling of the waveform by a single state-sensitive cell of the present embodiment.

FIG. 3 is a graph depicting an input signal waveform's amplitude (306) with respect to time (304), highlighting the sampling of the input signal waveform (302) by a state-sensitive cell of the present embodiment. As shown, for a given time (304) one of the device's state sensitive cells is gated to expose the cell to the input signal (308). Because the present embodiment relies upon the movement of charge carriers to effect a change in the state of the cell, it is necessary to expose the cell for a period of time to allow sufficient movement of charge carriers therein. This period of time over which the cell is exposed is $\Delta_t$ (310). Thus, to obtain $\Delta_t$ for the cell exposure the gate timing control (206) enables the gate circuitry at $t_{start}$ and disables the gate circuitry at $t_{stop}$ to obtain $t_{sample}$.

Figure 4:
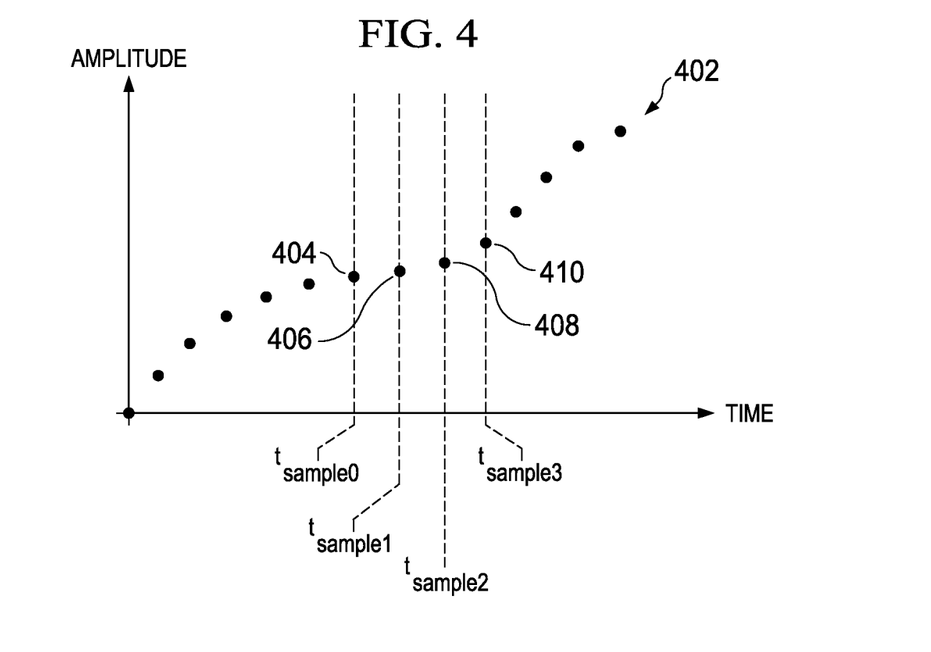
FIG. 4 is a graph depicting the input signal waveform as reconstructed from the exposed state-sensitive cells of the present embodiment.

Use of a single state sensitive cell for a single input signal capture is possible and may be preferable to use of multiple cells if all that is needed is to periodically sample a signal, for example, the output of a temperature sensor circuit. However, complex input signal waveforms (302) can be digitized and recreated based on the individual cell values if a plurality of cells is exposed in succession. FIG. 4 is a graph depicting the input signal waveform as sampled and/or reconstructed from the exposed state-sensitive cells of the present embodiment. As shown, the four cells of the embodiment: Cell 0 (214), Cell 1 (218), Cell 2 (222), and Cell 3 (226) are exposed for a $\Delta_t$ at $t_{sample0}$, $t_{sample1}$, $t_{sample2}$, and $t_{sample3}$ to obtain the sample points on the waveform represented by 404, 406, 408, and 410, respectively. If these cells are recycled quickly enough to perform repeated measurements, or if additional cells are provided, then the entire waveform (402) can be periodically sampled and the cell values can be combined to reconstruct the complete waveform (402). To return the instantaneous values to a smooth waveform requires only the application of simple smoothing functions to the point values. Such mathematical corrections are within the skill of one of ordinary skill in the art to which this invention pertains and, therefore, need not be described herein in further detail.

Again, the length of the input waveform sample and/or sample resolution that is desired may determine the number of cells in the device array. Because the memristor materials are physically small, it is possible to construct a large number of cells on an integrated circuit. Thus, cell densities in the gigabits are reasonably possible, allowing a lengthy waveform sample or high sample rate to be achieved. However, this also assumes that the array of cells will be exposed only once per sample. It is also possible, in other embodiments, to repeatedly cycle through the entire cell array, exposing cells while simultaneously reading the stored value of already-exposed cells (and resetting the read cell for subsequent reuse). Thus, any number of the plurality of cells may be utilized for a given sample/conversion sequence.

Referring once more to FIG. 2, the cell measurement control (210) component coordinates with the gate timing control (206) to read the cell values following exposure, and to reset the cell for subsequent re-exposure. Once a cell's gate is removed and the cell is shielded from the input signal following exposure, the cell measurement control (210) utilizes an automated processing device to measure the changed state of the cell and generate a digital value representative of the analog input signal to which the cell was exposed. In the present embodiment, which utilizes memristors, the cell measurement control utilizes comparators to ascertain the change in the exposed cell's resistance. This resistance change may then be compared to a calibration table entry to determine the representative digital value, which may then be reported to other processing hardware. The cell measurement control component may then return the memristor device to a predetermined initial resistance value or intermediate resistance value for subsequent cell exposures.

Given the variances in the memristor materials comprising a cell, calibration of the cells is important to generate an appropriate lookup table. The cell measurement control periodically or upon instruction performs the calibration in accordance with defined calibration parameters. For example, if a resolution of 0.001 Volts is desired, the cell calibration control circuitry (228) exposes each cell to the full range of expected values, in 0.001 Volt increments, and ascertains the resistance change. The time period for the exposure may also be varied to compensate for the input signal frequency. If the expected input signal is at a low frequency, then a longer exposure period ($\Delta_t$) may be utilized to ensure sufficient charge carrier migration and resulting resistance change. Each of these calibration factors (input voltage, $\Delta_t$, resistance response) is saved in memory for application during normal sampling and A/D conversion operations.

Figure 5:
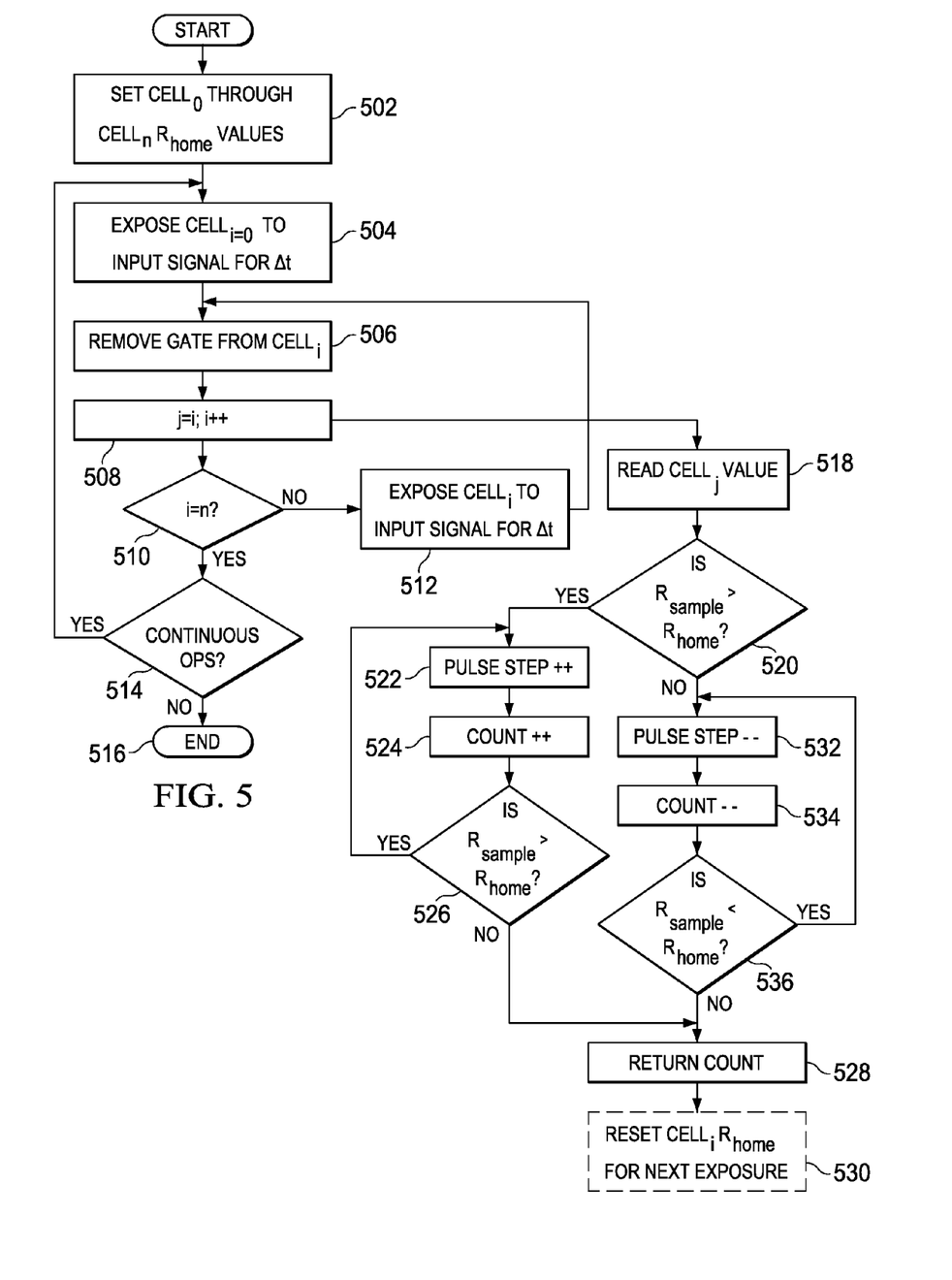
FIG. 5 is a flow diagram representing the function and decision steps taken by an embodiment of the present invention in sampling the input signal and generating a digital value representative thereof.

FIG. 5 is a flow diagram representing the function and decision steps taken by an embodiment of the present invention in sampling the input signal and generating a digital value representative thereof. As shown, the automated processing device begins the sample/conversion process by setting an initial (or home) resistance value ($R_{home}$) (502) with each cell by reversing the current flow through each cell until a minimum resistance is reached, and then restoring the current flow to increase the resistance to a predetermined value, which is typically at the midpoint between the cell's maximum ($R_{max}$) and minimum resistance ($R_{min}$) values. If the input signal is known to remain positive in polarity, then it may be suitable to leave $R_{home}$ at the minimum resistance value. If, however, the input signal is known to remain negative in polarity (reverse current flow through memristor) then it may be suitable to set $R_{home}$ at the maximum resistance value in order to provide additional room for the change in resistance.

Next, the input signal is applied and conditioned, and the first cell (Cell 0) is exposed to the input signal for a fixed period of time, or $\Delta_t$ (504) to cause its resistance to change based upon the input signal amplitude. This resistance is the sample resistance ($R_{sample}$). Once the gate is removed and the cell (Cell 0) is shielded from the input signal (506), the system notes the cell that was just exposed, and flags the current cell (Cell 0) for reading and the next cell (Cell 1) for exposure (508). The previously exposed cell (Cell 0) may then be read (518). If the last cell was reached (510) and continuous operation (sample/convert) is not desired, the sample/convert process ends (516). If the last cell was reached (510) and continuous operation is desired (514), the process repeats from Cell 0 (504). If, however, the final cell was not reached (510), the next cell is exposed for the period of time, or $\Delta_t$ (512), the gate is removed (506), and the shielded cell is read (518).

In the present embodiment, the flow diagram reflects use of comparators for cell reading (518). As shown, an excitation signal is applied to the cell being read and the new exposed resistance value ($R_{sample}$) is determined using a comparator. If $R_{sample}$ is greater than $R_h$ (520), then an excitation voltage pulse is applied to move $R_{sample}$ closer to $R_{home}$ (522) and a counter is incremented (524). The comparison is then made once more (526) and if $R_{sample}$ is still greater than $R_{home}$, the voltage is pulsed again (522) and the counter is incremented (524). Once $R_{sample}$ is no longer greater than $R_{home}$ (526) the count value is returned (528) and, if the cell is to be reused as with continuous operation, it is reset to the home resistance ($R_{home}$) for the next exposure (530). If $R_{sample}$ is less than $R_{home}$ (520), then a reverse excitation voltage pulse is applied to move $R_{sample}$ closer to $R_{home}$ (532) and a counter is decremented (534). The comparison is then made once more (536) and if $R_{sample}$ is still less than $R_{home}$, the voltage is pulsed again (532) and the counter is decremented (534). Once $R_{sample}$ is no longer greater than $R_{home}$ (536) the count value is returned (528) and, if the cell is to be reused as with continuous operation, it is reset to $R_{home}$ for the next exposure (530).

In another embodiment the memristor cell resistance value $R_{sample}$ is read directly (for example, with an ohmmeter device), compared with the initial resistance $R_{home}$ and a lookup of the calibration table is performed to determine the equivalent input source voltage amplitude that was necessary to generate the resistance change based on the exposure time for the cell. In another embodiment a constant current source is used as an excitation source to return $R_{sample}$ to $R_{home}$. The time required to achieve this is then used to determine the total amount of charge that was required, which equates with the total amount of charge the cell received during the original input signal exposure. This amount of charge can then be used to determine the initial input signal amplitude and the appropriate digital value representative of this input voltage can be determined. In another embodiment the difference between $R_{sample}$ and $R_{home}$ is noted and an estimate of the input signal exposure amplitude is made based on the operating characteristics of the cell. This estimated voltage amplitude is applied to the cell and the amount of time required to return the cell to $R_{home}$ is noted. If this return time differs from the original exposure time, the voltage estimate is revised accordingly and a digital value representative of the estimated exposure voltage is returned. In yet another embodiment the total amount of charge required to change the memristor resistance by a fixed amount is known based on the material characteristics of the memristor and the calibration results, and the input signal amplitude is determined by merely returning the sample resistance $R_{sample}$ to the intermediate resistance value that is between $R_{sample}$ and $R_{home}$. By returning to an intermediate resistance the input signal amplitude at exposure can be determined more quickly than if returning the memristor cell to $R_{home}$.

Figure 6:
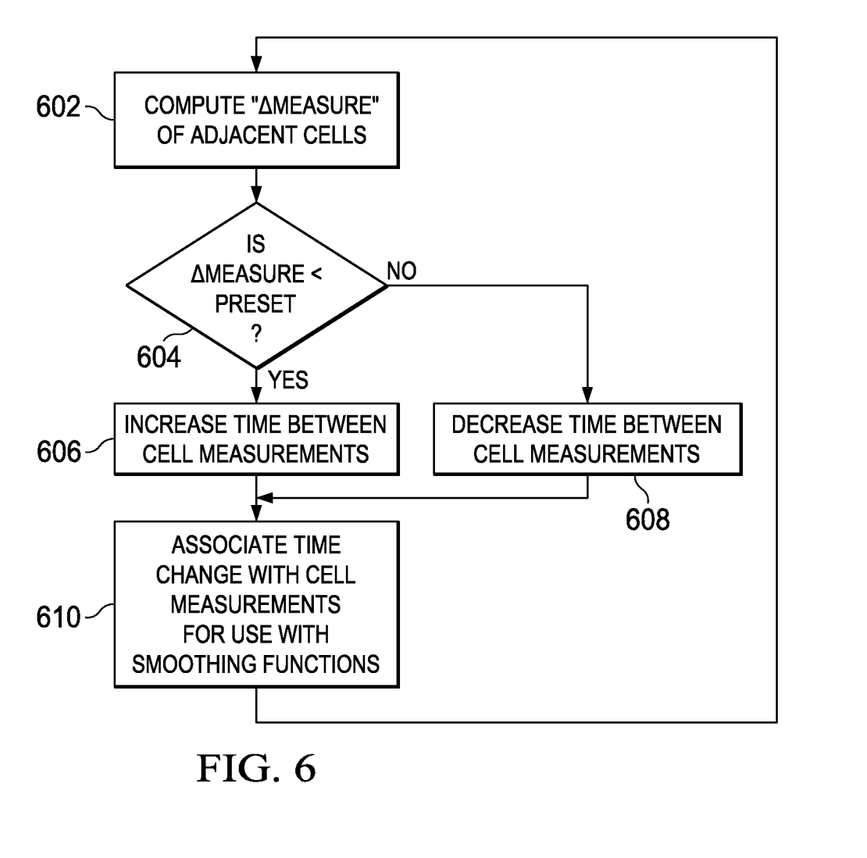
FIG. 6 is a flow diagram representing an embodiment of the present invention that affords variable exposure times for cell sampling of the input signal.

In another embodiment the Cell Measurement Control (210) may vary the cell exposure time depending on the characteristics of the analog input signal. For example, if the input signal remains steady for a period then fewer cell samples will be necessary to digitally represent or reconstruct the waveform. FIG. 6 is a flow diagram representing an embodiment of the present invention that affords variable exposure times for cell sampling of the input signal. As shown, the controller computes the difference in measurement between adjacent cells (602). If a statistically significant number of cells indicate that the input voltage is constant (604), then the time between subsequent samples may be extended to preserve the number of cells used (606). If, however, a statistically significant number of cells indicate that the input voltage is changing (604), then the time between subsequent samples is decreased to increase the resolution of the measurement (608). To allow subsequent processing to reconstruct the sampled input signal waveform, the exposure time is stored along with the respective cell sample so that a smoothing function may be applied (610).

Because of the operating characteristics of the memristor material, at high frequencies with a periodic wave the time required to displace charge carriers may be insufficient and the change in resistance for a given exposure would be reduced relative to a low frequency exposure. In another embodiment the automated processing device may compensate for this by obtaining one or more full cycles to ascertain the input signal frequency. Once the frequency is known, the processing device applies corrections to the individual cell readings due to this reduced state change.

The embodiment described herein is useful for numerous sample/conversion situations. For example, the embodiment may be incorporated into the input channel processing circuitry of a digital oscilloscope to provide a sample-and-hold function for measurement and digitization of an analog signal. Other uses include continuous sampling and conversion of analog waveforms for audio applications.

Figure 7:
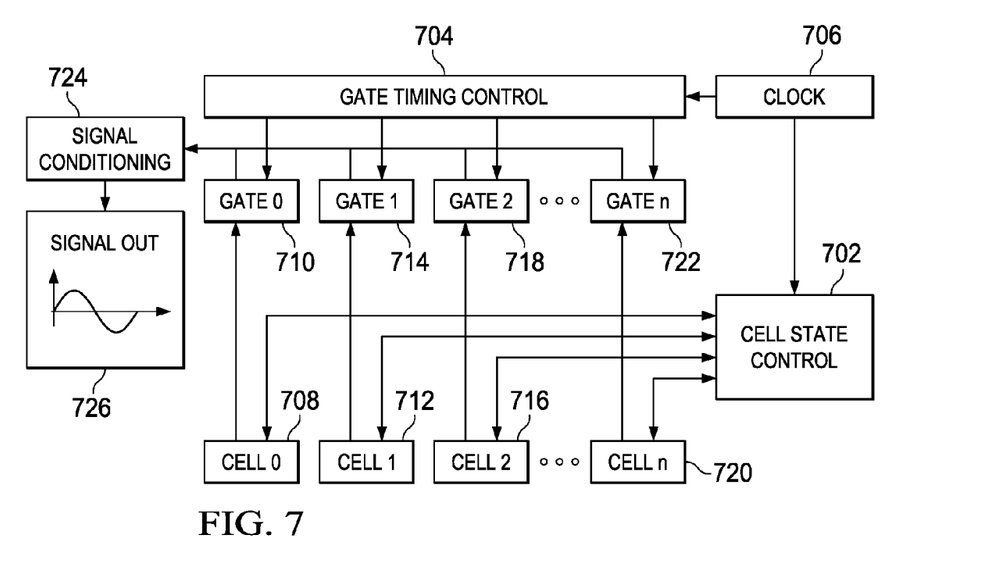
FIG. 7 is a block diagram of the state sensitive cell components that comprise an embodiment of the present invention in a digital to analog conversion capacity, highlighting conditioning, gate timing, and state control circuitry.

The state sensitive cell array may also perform digital to analog conversion to construct an analog waveform. FIG. 7 presents a block diagram of the state sensitive cell components that comprise an embodiment of the present invention in a digital to analog conversion capacity, highlighting conditioning (724), gate timing (704), and state control (702) components. The present embodiment utilizes memristor materials for the cell array. Cell 0 (708), Cell 1 (712), Cell 2 (716), through Cell n (720) comprise the state sensitive cell array, each in communication with the cell state control (702) component. The cell state control (702) comprises an automated processing device to accept a sequence of digital values and to compute the corresponding resistance value for each cell. This sequence of digital values may be provided in real time as a stream of values, or may be stored in an array of volatile or non-volatile memory registers accessible by the cell state control (702) automated processing device. The cell state control reads a digital value and produces an analog output pulse of appropriate amplitude and for the appropriate amount of time (i.e., the $\Delta_t$) to effect movement of a sufficient number of charge carriers within a cell to establish an initial operational resistance value ($R_{out}$). Other embodiments utilize memcapacitors or meminductors as the cell components. With respect to memcapacitors, the charge carrier movement affects the capacitance of the cell, which can be used as an input to a signal-conditioning component (724) to affect its output signal (726). With respect to meminductors, the charge carrier movement affects the inductance of the cell, which can be used as an input to a signal-conditioning component (724) to affect its output signal (726). Gate timing control (704) component is synchronized with the cell state control (702) via a clock (706) component. The gate timing control (704) controls individual gate devices Gate 0 (710), Gate 1 (714), Gate 2 (718), through Gate n (722), each of which is associated with a respective cell (Cell 0, Cell 1, Cell 2, through Cell n). Signal conditioning (724) component is provided to sense, isolate, and filter the cell states, and to generate the signal output (726). For example, when the gate timing control (704) enables Gate 0 (710), the state value of Cell 0 (708) is sensed by the signal-conditioning (724) component. In a similar fashion, when the gate timing control (704) enables Gate 1 (714), the state value of Cell 1 (712) is sensed by the signal-conditioning (724) component (etc., through Gate n/Cell n).

Figure 8:
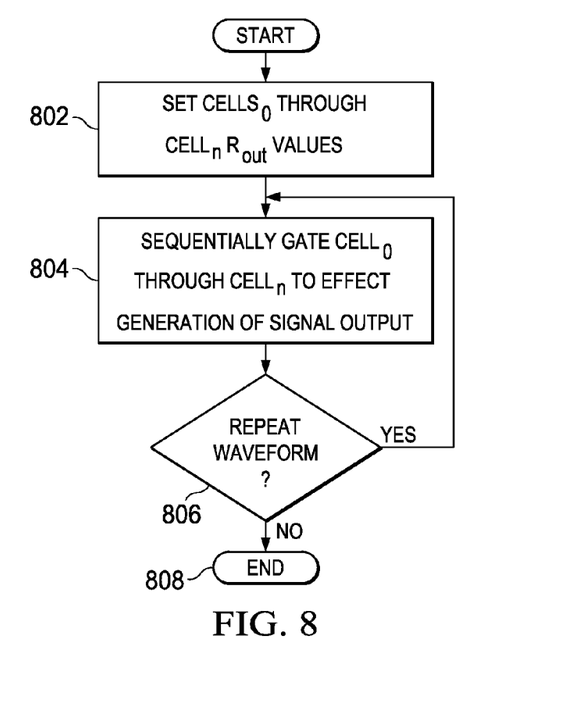
FIG. 8 is a flow diagram representing the steps taken by the embodiment to generate an analog output signal based upon digital input values.

FIG. 8 is a flow diagram representing the steps taken by the embodiment to generate an analog output signal based upon digital input values. The device first sets each of Cell 0 through Cell n states to an initial operational resistance value ($R_{out}$) that is representative of a sequence of digital input values. For example, the cell state control (702) receives a first digital input value representative of a first amplitude in an analog signal. In one embodiment the cell state control (702) converts this digital input value into a desired analog signal level by lookup table conversion (based on known behavior of cell as determined during calibration phase of the cell and prior understanding of the cell device characteristics), while in another embodiment the cell state control (702) utilizes DAC conversion of the digital input value. The first cell (Cell 0) is then pulsed to set its $R_{out}$ value, and the cell state control advances to the next cell in the sequence, where the next digital input value is accessed to determine the appropriate $R_{out}$ value for this cell. The cell state control (702) continues this advance through the digital input values and cells until reaching the nth cell, or until reaching the last digital input value in the sequence. The number of cells to utilize for recreation of the output waveform is determined by the desired resolution of the conversion and by the frequency of the sampled signal. A higher resolution conversion will require a greater number of cells, as will a higher frequency signal. In the situation in which a periodic sine wave is being recreated, it is necessary only to use a sufficient number of cells to recreate a single wavelength and then to repeatedly cycle through these cells to recreate a continuous sine wave.

Once the cells are set to their respective $R_{out}$ values, the gate timing control (704) sequentially gates each cell (from Cell 0 to Cell n) to effect generation of the analog output signal (804). With reference to FIG. 7, the gate timing control (704) enables Gate 0 (710) to allow the state value of Cell 0 (708) to cause the signal-conditioning (724) component to produce a segment of the output signal (726). To produce the next segment of the output signal the gate timing control (704) then disables Gate 0 (710) to shield Cell 0 (708), and enables Gate 1 (714) to allow the state value of Cell 1 (712) to cause the signal conditioning (724) component to produce the next segment of the output signal (726). This process repeats with subsequent cells until Cell n (720) is reached and the sequence then continues (repeats) with Cell 0, followed by Cell 1, etc. (806) to produce a continuous waveform or stops at Cell n (808) if a waveform segment is desired.

The signal conditioning (724) component in the present embodiment is adapted to generate an analog output signal whose amplitude varies with respect to a gated cell's state. As previously mentioned, when the gate timing control (704) enables the gate for a particular cell, that cell's state is sensed by the signal-conditioning (724) component. In the present embodiment in which the cells comprise memristor material, the cell's resistance ($R_{out}$ value) causes the signal-conditioning (724) component to vary the amplitude of the analog signal out (726). The signal-conditioning (724) component is further adapted to provide amplification and/or biasing of the output signal. The signal conditioning (724) component is further adapted to provide sufficient current isolation to minimize change in the sensed cell's state caused by the movement of charge carriers therein during the sensing process ("destructive read"). Because the gate timing control (704) and the cell state control (702) are synchronized (706), the cell state control (702) may be utilized to reset the cell's $R_{out}$ value immediately following a destructive read. Overall, the device is capable of functioning as a waveform generator, with an output waveform that can be shaped as desired based largely upon the digital input value stream that is provided. Other factors include the frequency at which the digital input values are applied to the signal conditioning (724) stage (i.e., frequency at which the cells are cycled) as well as amplification, biasing, and other such settings.

Figure 9:
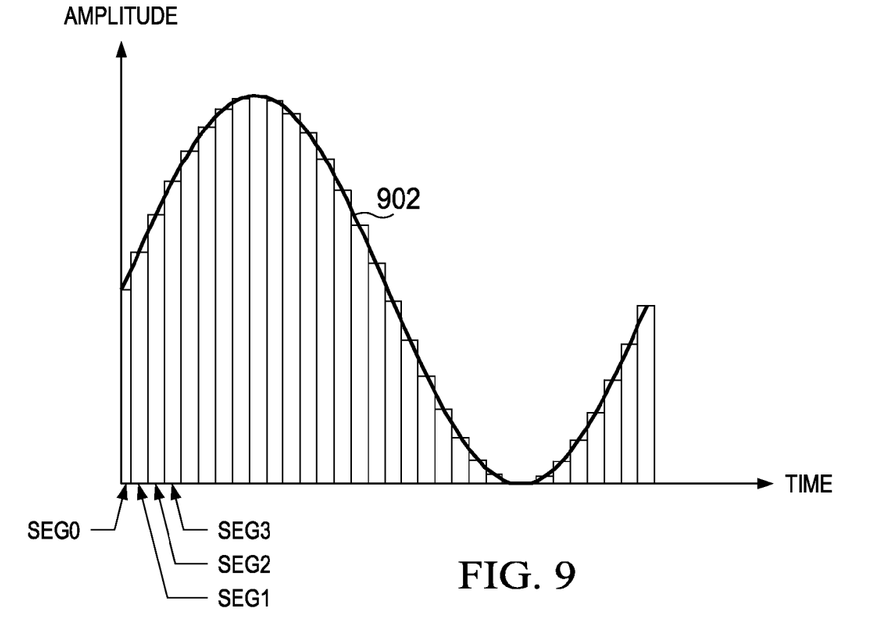
FIG. 9 is a graph depicting a single wavelength of a DC-biased sinusoidal waveform that was reconstructed from discrete amplitude values.
Figure 10:
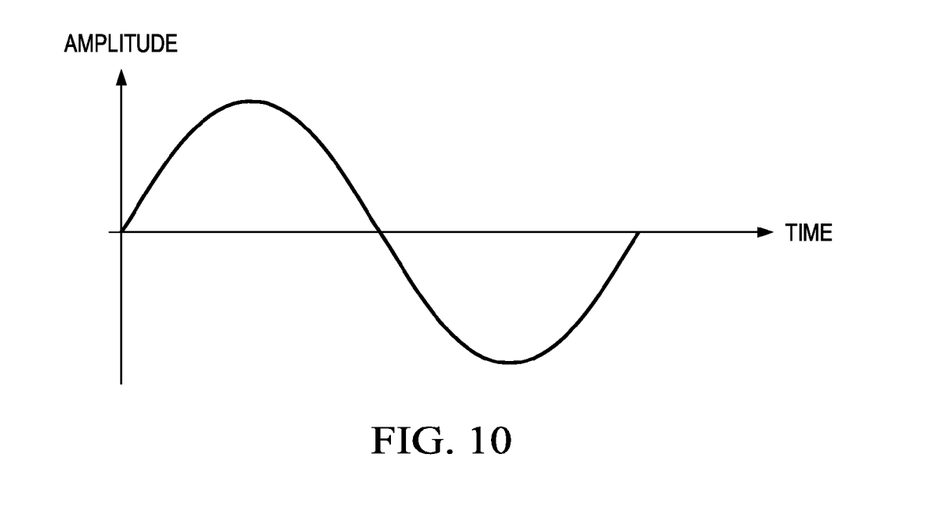
FIG. 10 is a graph depicting the sinusoidal waveform with the DC bias removed to create an AC sinusoidal waveform.

FIG. 9 is a graph depicting a single wavelength of a DC-biased sinusoidal waveform that was reconstructed using discrete amplitude values. If the goal is to produce a sinusoidal waveform, it is possible to combine the sequence of amplitude segments (Seg0, Seg1, Seg2, etc.) to form a stair-stepped approximated sine wave as depicted. In fact, any shape of stepped DC waveform may be generated in this fashion. Following the application of smoothing functions, it is possible to more closely approximate the smooth curves of a sine wave (902). The signal-conditioning (724) component may then remove the DC bias, if desired, to produce the AC waveform as depicted in FIG. 10.

The invention may be embodied in other specific forms without departing from the spirit or essential characteristics thereof. The present embodiments are therefore to be considered in all respects as illustrative and not restrictive. Accordingly, the scope of the invention is established by the appended claims rather than by the foregoing description. All changes that come within the meaning and range of equivalency of the claims are therefore intended to be embraced therein. Further, the recitation of method steps does not denote a particular sequence for execution of the steps. Such method steps may therefore be performed in a sequence other than that recited unless the particular claim expressly states otherwise.

I claim:

1. An analog to digital conversion device, the device comprising:
    a plurality of state sensitive memristor cells, each adapted to selectively receive an analog input signal for conversion;
    a gate timing control component adapted to selectively determine which of the plurality of state sensitive cells is to receive the analog input signal at a given time; and
    a cell measurement control component adapted to measure the change in the resistance of each of the plurality of state sensitive cells and to convert the measured change to a digital value representative of the received analog input signal amplitude.

2. The device of claim 1, wherein the gate timing control component is adapted to selectively allow sequential state sensitive cells to receive the analog input signal at a predetermined regular time interval.

3. The device of claim 1, wherein the gate timing control component is adapted to selectively allow sequential state sensitive cells to receive the analog input signal at an adaptable variable time interval.

4. The device of claim 1, the cell measurement control component further comprising:
    an analog to digital converter adapted to measure the change in the voltage drop across each of the plurality of state sensitive cells.

5. The device of claim 1, the cell measurement control component further comprising:
    a comparator circuit, a constant current circuit, and a counter circuit adapted to measure and compare an electrical resistance change of each of the plurality of state sensitive cells after receiving the analog input signal with the respective cell's initial resistance to produce the digital value representative of the received analog input signal voltage.

6. The device of claim 1, the cell measurement control component further comprising:
    an automated processing device adapted to determine the received input signal amplitude for each of the plurality of state sensitive cells based upon the time required to return each cell to a known resistance value.

7. The device of claim 1, the cell measurement control component further comprising:
    an automated processing device adapted to determine the received input signal amplitude for each of the plurality of state sensitive cells based upon the current required to return each cell to a known resistance value.

8. The device of claim 1, the cell measurement control component further comprising:
    an automated processing device adapted to determine the received input signal amplitude for each of the plurality of state sensitive cells based upon the voltage required to return each cell to a known resistance value.

9. The device of claim 1, the cell measurement control component further comprising:
    an automated processing device adapted to determine the received input signal amplitude for each of the plurality of state sensitive cells based upon the directly-measured resistance value of each of the plurality of state sensitive cells.

10. A method for performing analog to digital conversion of an analog input signal, the method steps comprising:
    a) providing an array of state sensitive cells, each cell having been initialized to an initial state value;
    b) exposing a first cell of the array to an analog input signal for a period of time to alter the first cell's initial state value;
    c) shielding the first cell from the analog input signal while measuring the change in the first cell altered state value; and
    d) determining a digital value based upon this altered state value, the digital value representative of the input signal amplitude to which the first cell was exposed.

11. The method of claim 10, the method steps further comprising:
    e) repeating steps b) through d) for one or more additional cells of the array.

12. The method of claim 10, the method steps further comprising:
    e) restoring the first cell of the array to its initial state value; and
    f) repeating steps b) through e) for the remaining cells of the array; and
    g) repeating steps b) through f) so as to repeatedly cycle through each of the cells in the array for a period of time.

13. The method of claim 10, the method steps further comprising:
    applying an excitation signal to the first cell to determine the cell's altered state value; and
    comparing the altered and initial state values to determine the digital value.

14. The method of claim 10, the method steps further comprising:
    applying a known excitation signal to the first cell and measuring the time required to return the first cell to the initial state value; and
    determining the digital value based upon the known excitation signal and the time required to return the first cell to the initial state value.

15. The method of claim 10, wherein the array of cells comprises memristor materials and the state value is an electrical resistance value.

16. The method of claim 15, the method steps further comprising:
    obtaining a plurality of operational data to correlate exposure voltage, exposure duration, and electrical resistance change for each of the plurality of state sensitive cells; and determining the digital value based on a comparison of the measured change in electrical resistance with the correlated data.

17. The method of claim 15, the method steps further comprising:
obtaining a plurality of operational data to correlate exposure current, exposure duration, and electrical resistance change for each of the plurality of state sensitive cells; and
determining the digital value based on a comparison of the measured change in electrical resistance with the correlated data.

18. The method of claim 15, the method steps further comprising:
determining the digital value based on the time required to return to a known resistance value.

19. The method of claim 15, the method steps further comprising:
determining the frequency of the analog input signal using a plurality of cell measurements; and
correcting the cell measurements based on the determined frequency.

\* \* \* \* \*